US008481992B2

(12) United States Patent
Kho et al.

(10) Patent No.: US 8,481,992 B2
(45) Date of Patent: Jul. 9, 2013

(54) FLAT PANEL DISPLAY AND METHOD FOR MAKING THE SAME

(75) Inventors: Sam Il Kho, Yongin-si (KR); Nam Choul Yang, Yongin-si (KR); Mu Hyun Kim, Yongin-si (KR); Jae Ho Lee, Yongin-si (KR); Young Gil Kwon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 908 days.

(21) Appl. No.: 11/595,217

(22) Filed: Nov. 9, 2006

(65) Prior Publication Data

US 2007/0122923 A1 May 31, 2007

(30) Foreign Application Priority Data

Nov. 30, 2005 (KR) .................. 10-2005-0115962

(51) Int. Cl.
*H01L 29/08* (2006.01)
*H01L 35/24* (2006.01)
*H01L 51/00* (2006.01)

(52) U.S. Cl.
USPC ................................. 257/40; 257/84; 438/99

(58) Field of Classification Search
USPC .......... 257/13, 83, 84, 103, 431, 432; 438/29, 438/69, 82, 99
See application file for complete search history.

(56) References Cited

U.S. PATENT DOCUMENTS

| 6,825,061 | B2* | 11/2004 | Hokari et al. ................ 438/99 |
| 7,582,545 | B2* | 9/2009 | Hirai et al. ................ 438/500 |
| 2003/0127657 | A1* | 7/2003 | Park ................ 257/79 |
| 2004/0056588 | A1* | 3/2004 | Nozawa ................ 313/504 |
| 2004/0180557 | A1* | 9/2004 | Park et al. ................ 438/787 |
| 2005/0186698 | A1* | 8/2005 | Ishida et al. ................ 438/99 |
| 2006/0197086 | A1* | 9/2006 | Rhee et al. ................ 257/59 |

FOREIGN PATENT DOCUMENTS

KR 10-2003-0066370 8/2003

OTHER PUBLICATIONS

Lee et al., "21.3: A New Patterning Method for Full-Color Polymer Light-Emitting Devices: Laser Induced Thermal Imaging (LITI)," *SID Symposium Digest of Technical Papers*; vol. 33, Issue 1; pp. 784-787; (May 2002).

Lee et al., "29.3: A Novel Patterning Method for Full-Color Organic Light-Emitting Devices: Laser Induced Thermal Imaging (LITI)," *SID Symposium Digest of Technical Papers*; vol. 35, Issue 1; pp. 1008-1011; (May 2004).

* cited by examiner

*Primary Examiner* — Daniel Whalen
(74) *Attorney, Agent, or Firm* — Knobbe Martens Olson & Bear LLP

(57) ABSTRACT

A flat panel display capable of preventing a chipping phenomenon of a pixel definition layer, and a method for making the same are disclosed. The flat panel display includes a thin film transistor formed on a substrate; a planarization layer formed on the thin film transistor; a first electrode layer formed on the planarization layer and electrically connected with the thin film transistor through the via hole formed in the planarization layer; a pixel definition layer formed on the planarization layer and in which an opening for at least partially exposing the first electrode layer is formed; an adhesive reinforcement layer formed at least between the planarization layer and the pixel definition layer on the top of the planarization layer; an emitting layer formed on the first electrode layer; and a second electrode layer formed on the emitting layer and the pixel definition layer. The flat panel display has an improved adhesive property between a pixel definition layer and an planarization layer, which prevents a chipping phenomenon of the pixel definition layer.

10 Claims, 4 Drawing Sheets

FLAT PANEL DISPLAY AND METHOD FOR MAKING THE SAME

CROSS-REFERENCE TO RELATED APPLICATIONS

This application claims the benefit of Korean Patent Application No. 10-2005-0115962, filed on Nov. 30, 2005, in the Korean Intellectual Property Office, the disclosure of which is incorporated herein by reference.

BACKGROUND

1. Field

The present disclosure relates to a flat panel display device and a method for making the same, and more specifically to a flat panel display device capable of preventing a chipping phenomenon of a pixel definition layer, and a method for making the same.

2. Description of the Related Technology

FIG. 1 is a schematic cross-sectional view of a flat panel display. Referring to FIG. 1, a flat panel display 10 includes a substrate 100, a thin film transistor 110, a planarization layer 120, a first electrode layer 130, a pixel definition layer 140, an emitting layer 150 and a second electrode layer 160.

A thin film transistor 110 is formed on the substrate 100. The thin film transistor 110 includes a semiconductor layer 111, a gate electrode 112 and source/drain electrodes 113a, 113b. A planarization layer 120 is formed on the thin film transistor 110. A first electrode layer 130 electrically connected to the source or drain electrodes 113a, 113b is formed on the planarization layer 120. A pixel definition layer 140 is formed on the first electrode layer 130 and includes an opening (not shown) for at least partially exposing the first electrode layer 130. An emitting layer 150 is formed on the pixel definition layer 140. A second electrode layer 160 is formed on the emitting layer 150 and the pixel definition layer 140.

The flat panel display described above has a problem that its charges do not move stably since a potential barrier (tunneling) is increased between the pixel definition layer 140 and the planarization layer 120 including the first electrode layer 130. This problem occurs because the pixel definition layer 140 is chipped from the planarization layer if the pixel definition layer 140 is not formed stably thereon.

SUMMARY OF CERTAIN INVENTIVE ASPECTS

One embodiment provides a flat panel display device comprising: a substrate; a planarization layer formed over the substrate; a first electrode formed over a portion of the planarization layer; a pixel definition layer formed over the planarization layer, the pixel definition layer including an opening exposing at least a portion of the first electrode; a second electrode formed over the first electrode and at least a portion of the pixel definition layer; an organic light emitting layer interposed between the first and second electrodes; and an adhesive reinforcement layer interposed between and contacting the planarization layer and the pixel definition layer.

The adhesive reinforcement layer may further comprise a portion interposed between and contacting the first electrode and the pixel definition layer. The adhesive reinforcement layer may further comprise a portion interposed between and contacting the first electrode and the organic light emitting layer. The flat panel display device may further comprise a thin film transistor interposed between the planarization layer and the substrate, wherein the first electrode further comprises another portion electrically connected to the thin film transistor through a via hole in the planarization layer, and wherein the adhesive reinforcement layer comprises a portion interposed between the pixel definition layer and the other portion of the first electrode.

The adhesive reinforcement layer may be formed of at least one material selected from the group consisting of siloxane, cyclohexane, toluene, para-xylene, and decahydronaphthalene. The siloxane may comprise decamethyl cyclopentasiloxane. The adhesive reinforcement layer may have a thickness of about 10 Å to about 50 Å.

The planarization layer may comprise a first planarization layer formed over the substrate and a second planarization layer formed on the first planarization layer. The first planarization layer may be formed of an inorganic material, and the second planarization layer may be formed of an organic material. The adhesion reinforcement layer may further comprise one that has been treated with at least one selected from the group consisting of sulfur, phosphorous, and hydrogen-helium ($H_2$—He). The device may comprise an organic light emitting display device.

Another embodiment provides a method for making a flat panel display. The method comprises: providing a substrate; forming a planarization layer over the substrate; forming a first electrode over a portion of the planarization layer; forming an adhesive reinforcement layer over at least a portion of the planarization layer; forming a pixel definition layer over the planarization layer and the adhesive reinforcement layer, the pixel definition layer including an opening for exposing at least a portion of the first electrode; forming an organic light-emitting layer over the first electrode through the opening; and forming a second electrode over the organic light-emitting layer and at least a portion of the pixel definition layer.

Forming the adhesive reinforcement layer may comprise forming the adhesive reinforcement layer on the at least a portion of the first electrode. The method may further comprise: forming a thin film transistor after providing the substrate and before forming the planarization layer; and forming a via hole in the planarization layer after forming the planarization layer and before forming the first electrode, wherein forming the first electrode comprises forming another portion electrically connecting the first electrode to the thin film transistor through the via hole, and wherein forming the adhesive reinforcement layer further comprises forming the adhesive reinforcement layer on the other portion of the first electrode.

The adhesive reinforcement layer may be formed of at least one material selected from the group consisting of siloxane, cyclohexane, toluene, para-xylene, and decahydronaphthalene. The siloxane may comprise decamethyl cyclopentasiloxane. The adhesive reinforcement layer may have a thickness of about 10 Å to about 50 Å. Forming the adhesive reinforcement layer may comprise using plasma. The method may further comprise treating the adhesive reinforcement layer with at least one material selected from the group consisting of sulfur, phosphorous, and hydrogen-helium ($H_2$—He). Forming the organic light-emitting layer may comprise using a laser-induced thermal imaging process.

Another embodiment provides a flat panel display including a thin film transistor formed on a substrate; a planarization layer formed on the thin film transistor; a first electrode layer formed on the planarization layer and electrically connected with the thin film transistor through the via hole formed in the planarization layer; a pixel definition layer formed on the planarization layer and in which an opening for at least partially exposing the first electrode layer is formed; an adhesive reinforcement layer formed at least between the planarization layer and the pixel definition layer in the top of the planarization layer; an emitting layer formed on the first electrode layer; and a second electrode layer formed on the emitting layer and the pixel definition layer.

The adhesive reinforcement layer may be formed on the first electrode layer and the planarization layer, and the adhesive reinforcement layer may be a material formed using plasma. The adhesive reinforcement layer may comprise one selected from siloxane (such as decamethylcyclopentasiloxane), cyclohexane, toluene, para-xylene, decahydronaphthalene and a mixture of two or more of the foregoing, and the adhesive reinforcement layer may have a thickness of about 10 Å to about 50 Å.

The planarization layer may include a first planarization layer formed on the thin film transistor and a second planarization layer formed on the first planarization layer. The first planarization layer may be formed of inorganic materials, and the second planarization layer may be formed of organic materials.

BRIEF DESCRIPTION OF THE DRAWINGS

These and/or other aspects and advantages of the instant embodiments will become apparent and more readily appreciated from the following description, taken in conjunction with the accompanying drawings of which.

DETAILED DESCRIPTION OF CERTAIN INVENTIVE EMBODIMENTS

Hereinafter, certain embodiments will be described with reference to the accompanying drawings.

Figure 1:
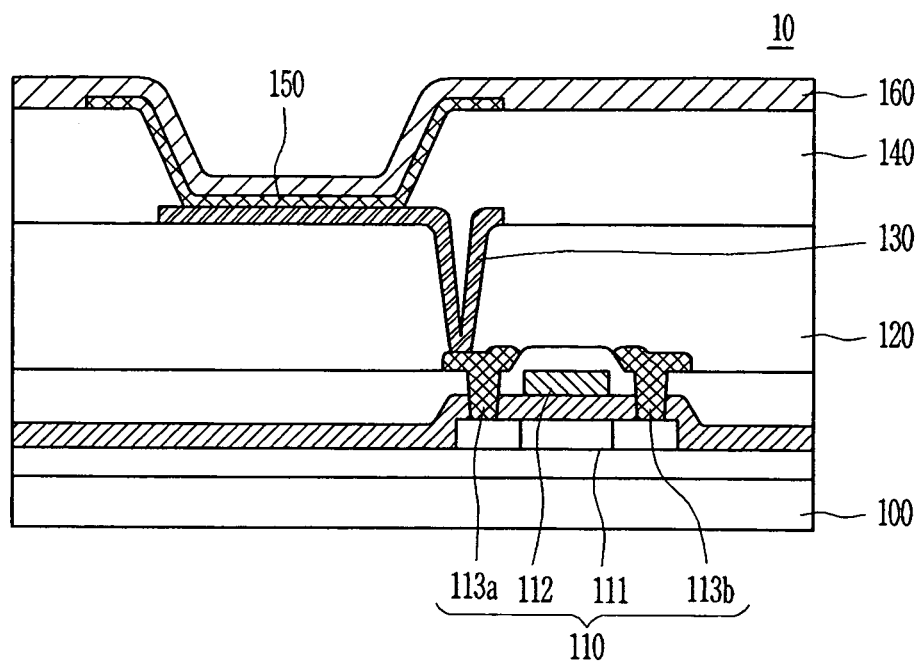
FIG. 1 is a schematic cross-sectional view showing a flat panel display.
Figure 2:
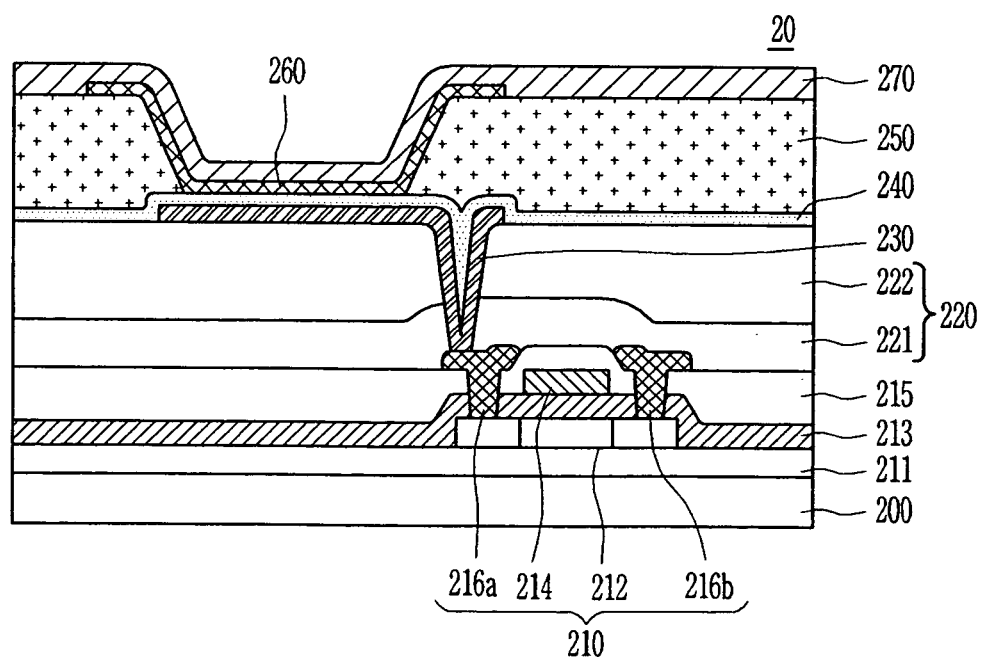
FIG. 2 is a schematic cross-sectional view showing a flat panel display according to a first embodiment.

FIG. 2 is a schematic cross-sectional view showing a flat panel display according to a first of the embodiments. Referring to FIG. 2, a flat panel display 20 includes a substrate 200, a thin film transistor 210, a planarization layer 220, a first electrode layer 230, an adhesive reinforcement layer 240, a pixel definition layer 250, an emitting layer 260 and a second electrode layer 270. The thin film transistor 210 includes a semiconductor layer 212, a gate electrode 214 and source/drain electrodes 216a, 216b.

The thin film transistor 210 is formed on the substrate 200 of the flat panel display 20. The substrate 200 is made of materials having an insulating property. Examples of such materials include, but are not limited to, glass and synthetic resins. A first insulating layer 211 is formed on the substrate 200 and serves as a buffer layer.

Hereinafter, the thin film transistor 210 will be described in detail. A semiconductor layer 212 of the thin film transistor 210 is formed on a first insulating layer 211. This semiconductor layer 212 may be formed of silicon or organic materials. A second insulating layer 213 is formed on the semiconductor layer 212.

A gate electrode 214 of the thin film transistor 210 is formed on the second insulating layer 213, and the gate electrode 214 may be formed on a channel region of the semiconductor layer 212. A third insulating layer 215 is formed on the gate electrode 214. The first to third insulating layers 211, 213, 215 are formed of, but not limited to, an oxide film, nitride film, and the like.

Source/drain electrodes 216a, 216b of the thin film transistor 210 are formed to be electrically connected to the semiconductor layer 212 through contact holes formed in the third insulating layer 215 and the second insulating layer 213.

The planarization layer 220 is formed on the thin film transistor 210 and the third insulating layer 215. The planarization layer 220 includes a first planarization layer 221 formed of an inorganic layer and a second planarization layer 222 formed of an organic layer. The first planarization layer 221 may be formed of inorganic insulating materials such as silicon oxide ($SiO_2$), nitride oxide (SiNx), and the like, and the second planarization layer 222 may be formed of organic insulating materials such as acryl organic compounds, polyamide polymers, polyimide polymers, and the like. The first planarization layer 221 is formed on the thin film transistor 210 and the third insulating layer 215, and the second planarization layer 222 is formed on the first planarization layer 221.

The first electrode layer 230 is electrically connected to the source or drain electrode 216a, 216b through a via hole formed in the planarization layer 220. The first electrode layer 230 may be formed of a single layer or a multiple layers. The first electrode layer 230 may be formed of at least one of aluminum, aluminum alloy, silver, silver alloy, ITO, IZO as well as any other suitable conductive metal oxides.

In the illustrated embodiment, the adhesive reinforcement layer 240 is formed on the planarization layer 220 including the first electrode layer 230. The adhesive reinforcement layer 240 is formed using plasma. For example, the adhesive reinforcement layer 240 may be a plasma polymer layer formed using a plasma polymer polymerization process.

Generally, the adhesive reinforcement layer 240 has various properties according to its manufacturing conditions, for example, a deposition pressure, a carrier gas, a flow rate, a plasma power, and the like in the case of using the plasma polymer. More specifically, a thin film deposited using the plasma polymer does not have a pin-hole, and also is capable of being laminated in a large-area and ultra thin-film form and has an improved adhesion property and a high optical transmission even at a visible range.

The adhesive reinforcement layer 240 is formed using one selected from siloxane (e.g., decamethylcyclopentasiloxane), cyclohexane, toluene, para-xylene, decahydronaphthalene and a mixture of two or more of the foregoing.

In one embodiment, the adhesive reinforcement layer 240 may have a thickness of about 10 Å to about 50 Å. Optionally, the adhesive reinforcement layer 240 may have a thickness of about 30 Å. In other embodiments, the adhesive reinforcement layer 240 may have various thicknesses as long as the adhesive reinforcement layer 240 does not interfere with the transportation of the holes and electrons.

The adhesive reinforcement layer 240 may improve an adhesive property of the pixel definition layer 250 by means of chemical functional groups (dangling bonds) of the plasma polymer surface, and enhance the number of the chemical functional groups (the dangling bonds) by further adding sulfur (S), phosphorus (P), and the like onto the adhesive reinforcement layer 240.

The adhesive reinforcement layer 240 may be subject to a pre-treatment and a post treatment (a surface treatment and UV curing) after the deposition. Such treatments increase carbon-hydrogen (C—H) bonds on the adhesive reinforcement layer 240 by adding hydrogen-helium ($H_2$—He) onto the polymer-plasma adhesive reinforcement layer 240, thereby further increasing the number of the chemical functional groups (the dangling bonds) of a surface of the adhesive reinforcement layer 240 and enhancing the thermal stability of the adhesive reinforcement layer 240. Also, a high-density thin film having compact particles and a smooth surface may be formed since suitable cross-links are formed within the adhesive reinforcement layer 240.

The pixel definition layer 250 is formed on the planarization layer 220 and includes an opening (not shown) for at least partially exposing the first electrode layer 230.

The emitting layer 260 is formed on the adhesive reinforcement layer 240, and the emitting layer 260 may further include some of an electron transport layer and an electron injection layer. This emitting layer 260 emits the light by recombination of holes and electrons injected from the first electrode layer 230 and the second electrode layer 270 to the emitting layer 260. Also, the emitting layer 260 may further include an electron transport layer and an electron injection layer between the emitting layer 260 and the second electrode layer 270.

The second electrode layer 270 is formed on the emitting layer 260 and the pixel definition layer 250. The second electrode layer 270 may be formed of at least one material selected from the group consisting of aluminum (Al), calcium (Ca), silver (Ag), aluminum alloy, and silver alloy.

FIG. 3a to FIG. 3d are schematic side views showing each step in a method for making a flat panel display according to one of the instant embodiments. For brevity of description, detailed descriptions of the same components as in FIG. 2 are omitted.

Figure 3A:
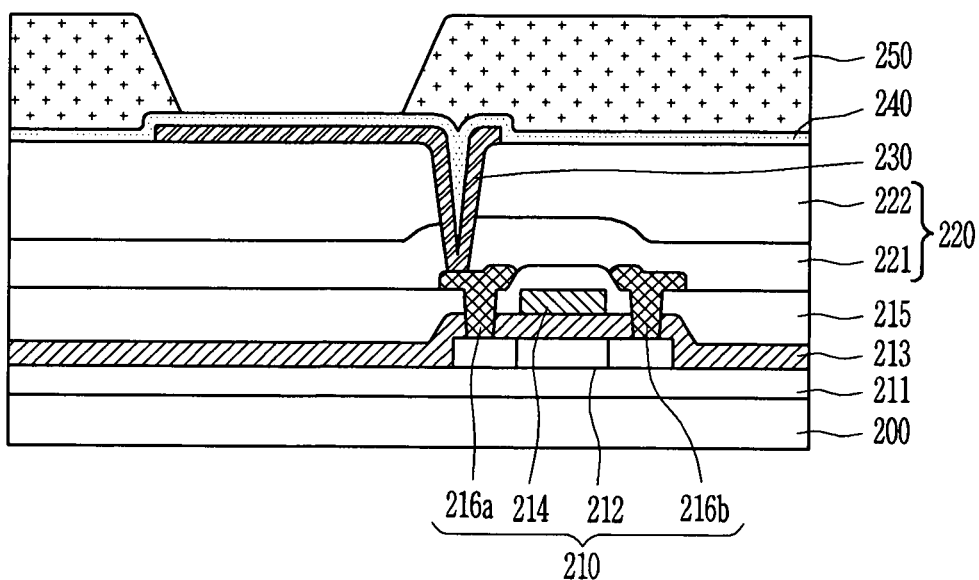
FIGS. 3a to 3d are schematic cross-sectional views showing a method for making a flat panel display according to one embodiment.

First, a planarization layer 220 is formed on the substrate in which a thin film transistor 210 is formed, as shown in FIG. 3a. The planarization layer 220 includes a first planarization layer 221 formed of an inorganic layer and a second planarization layer 222 formed of an organic layer. The first planarization layer 221 may include inorganic insulating materials such as silicon oxide ($SiO_2$), nitride oxide (SiNx), and the like. The second planarization layer 222 may include organic insulating materials such as acryl organic compounds, polyamide polymers, polyimide polymers, and the like. The first planarization layer 221 is formed on the thin film transistor 210, and the second planarization layer 222 is formed on the first planarization layer 221.

A first electrode layer 230 is formed on the planarization layer 220 and is electrically connected with one of the source and drain electrodes 216a, 216b through a via hole (not shown) formed to expose at least one of the source and drain electrodes 216a, 216b by etching one region of the planarization layer 220.

In the illustrated embodiment, an adhesive reinforcement layer 240 is formed on the planarization layer 220 including the first electrode layer 230. In one embodiment, the adhesive reinforcement layer 240 may be formed using plasma. The reinforcement layer may be a plasma polymer layer formed through plasma polymer polymerization.

The adhesive reinforcement layer 240 may have various properties depending on its manufacturing conditions, for example a deposition pressure, a carrier gas, a flow rate, plasma power, and the like in the case of using the plasma polymer. More specifically, a thin film deposited using the plasma polymer does not have a pin-hole, and also is capable of being laminated in a large-area and ultrathin-film form and has an improved adhesion property and a high optical transmission even at a visible range.

The adhesive reinforcement layer 240 may include one selected from siloxane (e.g., decamethylcyclopentasiloxane), cyclohexane, toluene, para-xylene, decahydronaphthalene and a mixture of two or more of the foregoing. The adhesive reinforcement layer 240 is preferably formed to a thickness of about 10 Å to about 50 Å. Optionally, the adhesive reinforcement layer 240 may have a thickness of about 30 Å.

The adhesive reinforcement layer 240 may improve an adhesive property of the pixel definition layer 250 by means of chemical functional groups (dangling bonds) of the plasma polymer surface, and enhance the number of the chemical functional groups (the dangling bonds) by further adding sulfur (S), phosphorus (P), and the like onto the adhesive reinforcement layer 240.

The adhesive reinforcement layer 240 may be subject to a pre-treatment and/or a post treatment (a surface treatment and UV curing) after the deposition. These treatments increase carbon-hydrogen (C—H) bonds on the adhesive reinforcement layer 240 by adding hydrogen-helium ($H_2$—He) onto the polymer-plasma adhesive reinforcement layer 240, thereby further increasing the number of the chemical functional groups (the dangling bonds) of a surface of the adhesive reinforcement layer 240 and enhancing the thermal stability of the adhesive reinforcement layer 240. Also, a high-density thin film having compact particles and a smooth surface may be formed since suitable cross-links are formed within the adhesive reinforcement layer 240.

The pixel definition layer 250 is formed on the planarization layer 220 and includes an opening for at least partially exposing the first electrode layer 230.

Figure 3B:
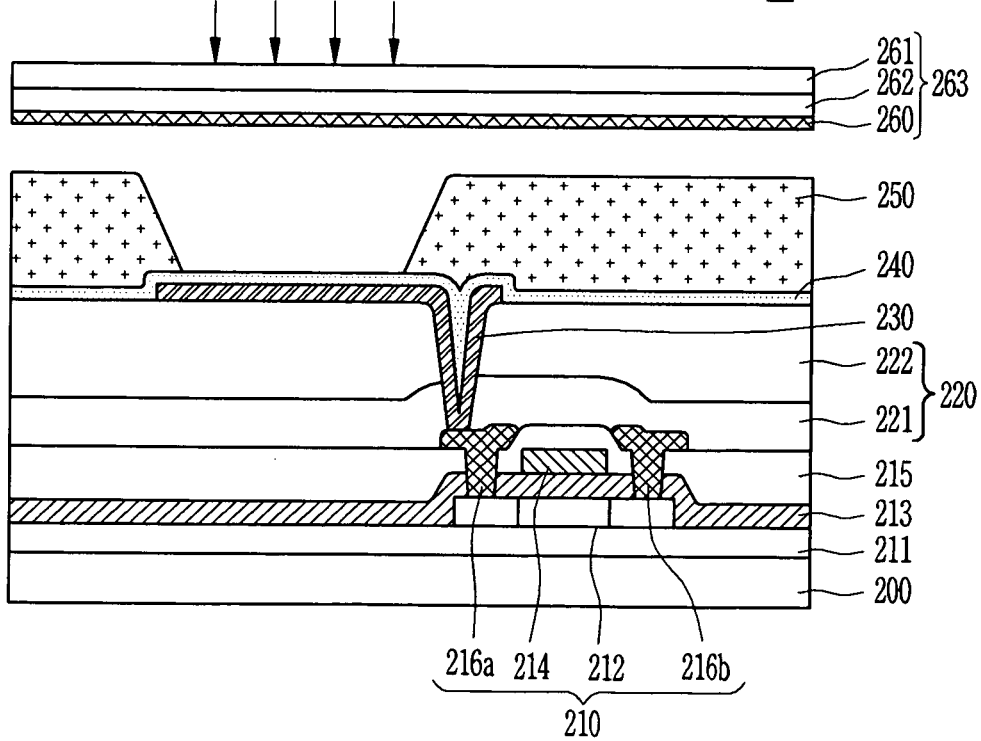

Next, referring to FIG. 3b, in order to form an emitting layer 260 over the substrate 200, a donor film 263 in which the emitting layer 260 is formed is arranged on the substrate 200. The emitting layer 260 of the donor film 263 is arranged on the substrate 200 to face each other. The donor film 263 includes a base substrate 261, a light-heat conversion layer 262 formed on the base substrate 261, and an emitting layer 260 formed on the light-heat conversion layer 262. The donor film 263 may further include an interlayer insertion layer (not shown) between the light-heat conversion layer 262 and the emitting layer 260.

The base substrate 261 serves to support an organic layer for forming the emitting layer. In one embodiment, the base substrate has at least about 90% of optical transmittance. Examples of materials for the base substrate 261 include, but are not limited to, polyester, polycarbonate, polyolefin, polyvinyl, and polyethyleneterephthalate (PET) resins.

The light-heat conversion layer 262 serves to convert light into heat for transferring the organic layer to over the substrate 200. In one embodiment, the light-heat conversion layer 262 includes a radiation absorber for absorbing a laser to convert it to heat. In one embodiment, the light-heat conversion layer 262 is formed to a thickness of about 1 μm to about 5 μm.

The light-heat conversion layer 262 is formed in a thin-film form. The conversion layer 262 may include metallic and metal compounds. In one embodiment, the light-heat conversion layer 262 may be formed using the dry processes such as sputtering and evaporating depositions. A particulate coating may be formed using a binder, and any suitable dry or wet coating methods. An interlayer insertion layer (not shown) for protecting the light-heat conversion layer 262 functions to prevent materials in the light-heat conversion layer 262 from entering the emitting layer 260.

Figure 3C:
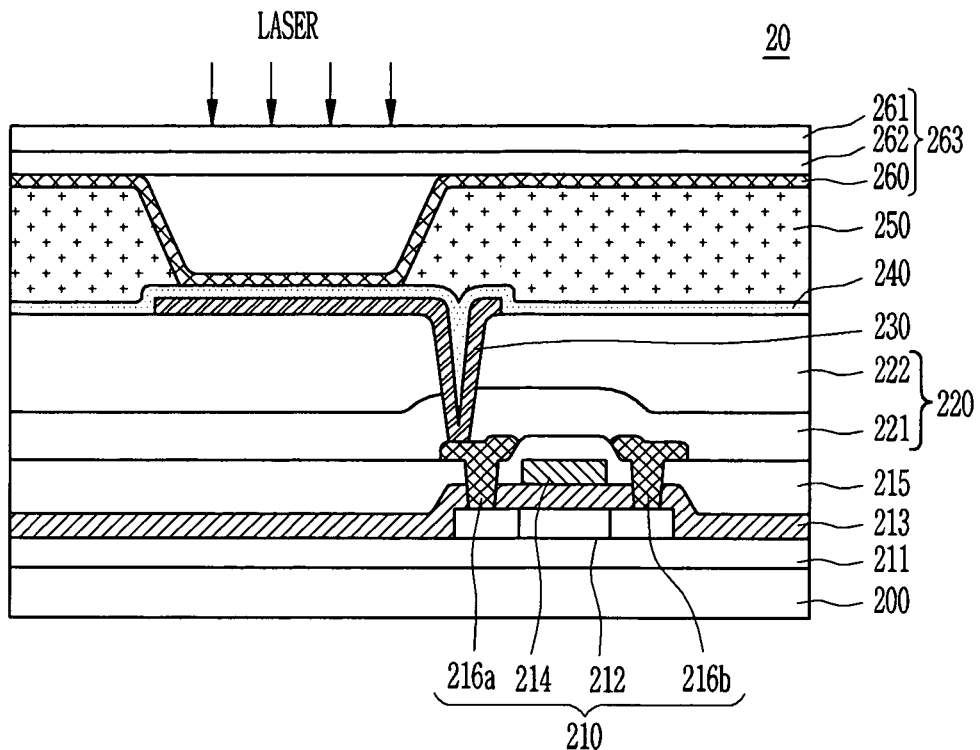

Subsequently, referring to FIG. 3c, a donor film 263 is arranged over the partially fabricated flat panel display 20, and a laser is irradiated to a region of the donor film 263 onto which the emitting layer 260 is transferred. As the light-heat conversion layer 262 expands in the region of the donor film 263 to which the laser is irradiated, the emitting layer 260 is separated from the donor film 263 while expanding, thereby transferring the patterned emitting layer 260 to the flat panel display 20. The method for forming the emitting layer using the above-mentioned principle is referred to as a laser induced thermal imaging.

Figure 3D:
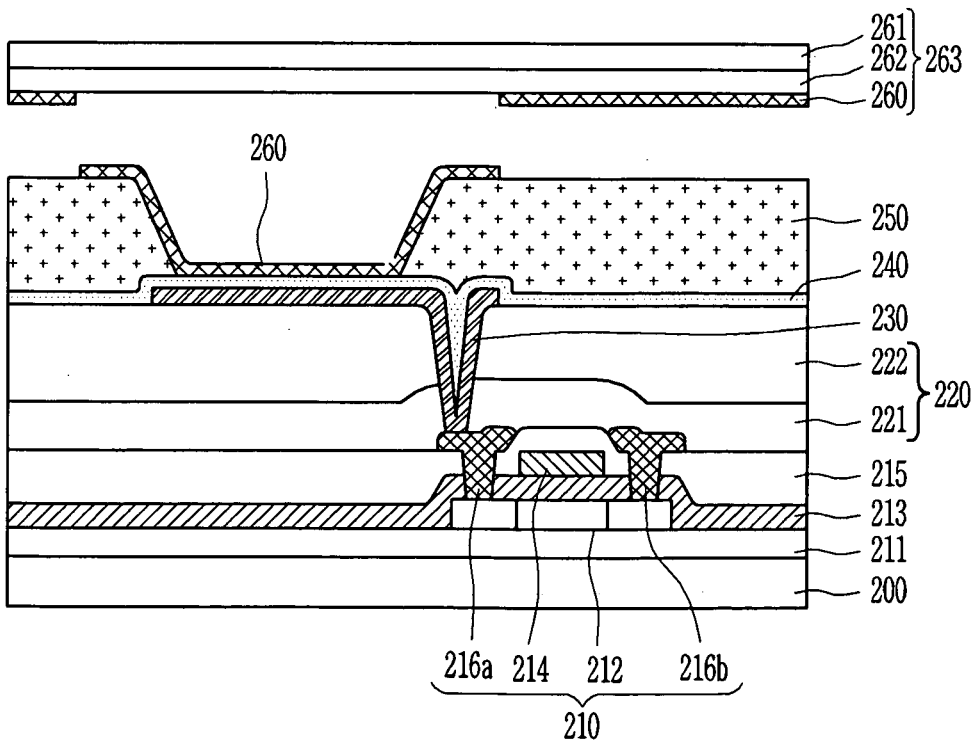

Hereinafter, referring to FIG. 3d, once the emitting layer 260 is transferred to the flat panel display 20, the flat panel display 20 is separated from the donor film 263. In the emitting layer 260 below the donor film 263, only the region of the emitting layer 260 to which the laser is irradiated is transferred. However, regions of the emitting layer 260 to which the laser is not irradiated remain intact on the donor film 263. After the emitting layer 260 is transferred, a second electrode layer 270 is formed on the pixel definition layer 250 and the emitting layer 260.

Figure 4:
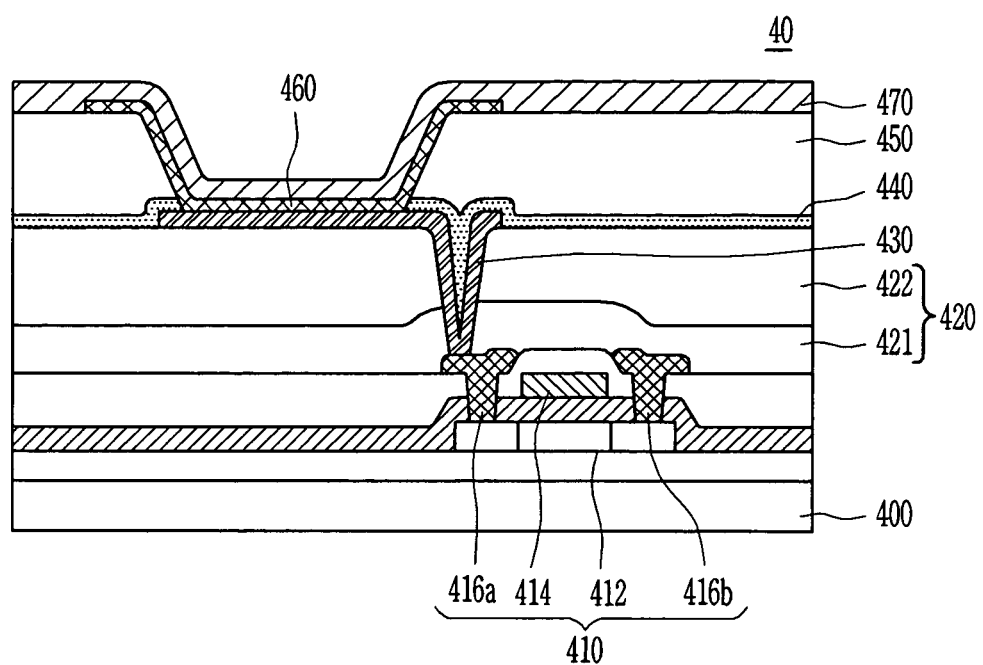
FIG. 4 is a schematic cross-sectional view showing a flat panel display according to a second embodiment.

FIG. 4 is a schematic cross-sectional view showing a flat panel display according to another of the embodiments. Referring to FIG. 4, a flat panel display 40 includes a substrate 400, a thin film transistor 410, a planarization layer 420, a first electrode layer 430, an adhesive reinforcement layer 440, a pixel definition layer 450, an emitting layer 460 and a second electrode layer 470. The thin film transistor 410 includes a semiconductor layer 412, a gate electrode 414 and a source/drain electrode 416.

In order to avoid repeated description, detailed descriptions of the same components as in the above-mentioned first embodiment, for example a substrate 400, a thin film transistor 410, a planarization layer 420, a first electrode layer 430, an emitting layer 460 and a second electrode layer 470 are omitted.

A thin film transistor 410 is formed on the substrate 400. The thin film transistor 410 includes a semiconductor layer 412, a gate electrode 414, and source/drain electrodes 416a, 416b.

The planarization layer 420 is formed on the thin film transistor 410. The planarization layer 420 includes a first planarization layer 421 formed of an inorganic layer and a second planarization layer 422 formed of an organic layer.

The first electrode layer 430 is formed to be electrically connected with the source or drain electrodes 416a, 416b through a via hole (not shown) formed in the planarization layer 420.

The pixel definition layer 450 is formed on the planarization layer 420, and an opening (not shown) for at least partially exposing the first electrode layer 430 is formed in the pixel definition layer 450.

The adhesive reinforcement layer 440 is formed between the planarization layer 420 and the pixel definition layer 450. In the illustrated embodiment, however, the adhesive reinforcement layer 440 is not formed over at least a portion of the first electrode 430. The adhesive reinforcement layer 440 is formed using plasma. The reinforcement layer 440 may be, for example, a plasma polymer layer formed using plasma polymer polymerization.

Generally, the adhesive reinforcement layer 440 has various properties depending on its manufacturing conditions, for example a deposition pressure, a carrier gas, a flow rate, a plasma power, and the like in the case of using the plasma polymer. More specifically, a thin film deposited using the plasma polymer does not have a pin-hole, and also is capable of being laminated in a large-area and ultrathin-film form and has an improved adhesion property and a high optical transmission even at a visible range.

The adhesive reinforcement layer 440 may be formed of siloxane (e.g., decamethylcyclopentasiloxane), cyclohexane, toluene, para-xylene, decahydronaphthalene and a mixture of two or more of the foregoing.

In one embodiment, the adhesive reinforcement layer 440 has a thickness of about 10 Å to about 50 Å. Optionally, the adhesive reinforcement layer 440 may have a thickness of about 30 Å.

The adhesive reinforcement layer 440 may improve an adhesive property of the pixel definition layer 450 by means of chemical functional groups (dangling bonds) of the plasma polymer surface, and enhance the number of the chemical functional groups (the dangling bonds) by further adding sulfur (S), phosphorus (P), and the like onto the adhesive reinforcement layer 440.

The adhesive reinforcement layer 440 may be subject to a pre-treatment and a post treatment (a surface treatment and UV curing) after the deposition. These processes may increase carbon-hydrogen (C—H) bonds on the adhesive reinforcement layer 440 by adding hydrogen-helium ($H_2$—He) onto the polymer-plasma adhesive reinforcement layer 440, thereby further increasing the number of the chemical functional groups (the dangling bonds) of a surface of the adhesive reinforcement layer 440 and enhancing a thermal stability of the adhesive reinforcement layer 440. Also, a high-density thin film having compact particles and a smooth surface may be formed since suitable cross-links are formed within the adhesive reinforcement layer 440.

As described above, the flat panel display according to the embodiments can improve an adhesive property of the pixel definition layer by forming the adhesive reinforcement layer in at least one region between the planarization layer and the pixel definition layer. A chipping phenomenon of the pixel definition layer can be also prevented due to the improved adhesive property of the pixel definition layer. Accordingly, the flat panel display can be realized to have large-area and high-resolution pixels.

Although a few embodiments have been shown and described, it would be appreciated by those skilled in the art that changes might be made in this embodiment without departing from the principles and spirit of the instant disclosure, the scope of which is defined in the claims and their equivalents.

What is claimed is:
1. A flat panel display device comprising:
    a substrate;
    a planarization layer formed over the substrate;
    a first electrode formed over a portion of the planarization layer;
    a pixel definition layer formed over the planarization layer, the pixel definition layer including an opening exposing at least a portion of the first electrode;
    a second electrode formed over the first electrode and at least a portion of the pixel definition layer;
    an emitting layer interposed between the first and second electrodes; and
    an adhesive reinforcement layer interposed between and contacting the planarization layer and the pixel definition layer, wherein the adhesive reinforcement is a plasma polymer layer which comprises an organic material, wherein the organic material is at least one of siloxane, cyclohexane, toluene, para-xylene, and decahydronaphthalene and wherein the adhesive reinforcement layer has a thickness of about 10 Å to about 50 Å.
2. The flat panel display device of claim 1, wherein the adhesive reinforcement layer further comprises a portion interposed between and contacting the first electrode and the pixel definition layer.

3. The flat panel display device of claim 1, wherein the adhesive reinforcement layer further comprises a portion interposed between and contacting the first electrode and the emitting layer.

4. The flat panel display device of claim 1, further comprising a thin film transistor interposed between the planarization layer and the substrate, wherein the first electrode further comprises another portion electrically connected to the thin film transistor through a via hole in the planarization layer, and wherein the adhesive reinforcement layer comprises a portion interposed between the pixel definition layer and the other portion of the first electrode.

5. The flat panel display device of claim 1, wherein the siloxane comprises decamethyl cyclopentasiloxane.

6. The flat panel display device of claim 1, wherein the planarization layer comprises a first planarization layer formed over the substrate and a second planarization layer formed on the first planarization layer.

7. The flat panel display device of claim 6, wherein the first planarization layer is formed of an inorganic material, and wherein the second planarization layer is formed of an organic material.

8. The flat panel display device of claim 1, wherein the adhesion reinforcement layer further comprises at least one selected from the group consisting of sulfur, phosphorous, and hydrogen-helium ($H_2$—He).

9. The flat panel display device of claim 1, wherein the device comprises an organic light emitting display device.

10. The flat panel display device of claim 1, wherein the emitting layer is organic.

* * * * *